(12) United States Patent
Veneruso et al.

(10) Patent No.: US 7,629,604 B2
(45) Date of Patent: Dec. 8, 2009

(54) NANO-BASED DEVICE AND METHOD

(75) Inventors: Anthony F. Veneruso, Paris (FR); John Ullo, Sudbury, MA (US); David Gerez, Houston, TX (US); Bingqing Wei, Baton Rouge, LA (US); Abhilash Krishna, Baton Rouge, LA (US)

(73) Assignees: Schlumberger Technology Corporation, Sugar Land, TX (US); Louisana State University & Agricultural & Mechanical College, Baton Rouge, LA (US)

( * ) Notice: Subject to any disclaimer, the term of this patent is extended or adjusted under 35 U.S.C. 154(b) by 332 days.

(21) Appl. No.: 11/164,118

(22) Filed: Nov. 10, 2005

(65) Prior Publication Data

US 2007/0105249 A1 May 10, 2007

(51) Int. Cl.
*H01L 29/08* (2006.01)
(52) U.S. Cl. .................. 257/29; 257/E29.168
(58) Field of Classification Search .......... 257/26, 257/29, E29.168
See application file for complete search history.

(56) References Cited

U.S. PATENT DOCUMENTS

| 5,266,155 | A | * | 11/1993 | Gray | ............ 216/18 |
| 2002/0048135 | A1 | | 4/2002 | Lerche et al. | |
| 2002/0060514 | A1 | * | 5/2002 | Nakamoto | ........... 313/311 |
| 2002/0113544 | A1 | | 8/2002 | Lee et al. | |
| 2002/0175617 | A1 | | 11/2002 | Lee | |
| 2003/0067259 | A1 | | 4/2003 | Nishimura | |
| 2003/0200890 | A1 | | 10/2003 | Reynolds et al. | |
| 2004/0003743 | A1 | | 1/2004 | Brooks et al. | |
| 2004/0160726 | A1 | | 8/2004 | Lerche et al. | |
| 2005/0178282 | A1 | | 8/2005 | Brooks et al. | |
| 2005/0266766 | A1 | | 12/2005 | Wei | |

FOREIGN PATENT DOCUMENTS

| EP | 1698878 A1 | 9/2006 |
| JP | 200571965 A | 8/2003 |
| JP | 2004071527 A | 3/2004 |
| JP | 2004259684 A | 9/2004 |
| JP | 2005162571 A | 6/2005 |

OTHER PUBLICATIONS

Veneruso, U.S. Appl. No. 11/164,144, filed Nov. 11, 2005 for Nano-Based Devices for Use in a Wellbore.
Teo et al., Fabrication and electrical characteristics of carbon nanotube-based microcathodes for use in a parallel electron-beam lithography system, J. Vac. Sci. Technol. B21(2), Mar./Apr. 2003, 693-697.

(Continued)

*Primary Examiner*—Davienne Monbleau
*Assistant Examiner*—Matthew Reames
(74) *Attorney, Agent, or Firm*—Trop, Pruner & Hu, P.C.; Kevin Brayton McGoff; James L. Kurka (57) ABSTRACT

A nano-based device includes a support structure providing a support surface, a second structure providing a second surface angled with respect to the support surface, and at least one nano-emitter provided on the second surface.

18 Claims, 6 Drawing Sheets

OTHER PUBLICATIONS

Milne et al., Carbon nanotubes as field emission sources, J. Mater. Chem., 2004, 14, 1-12.

Knight, Controllable nano-diode created, newScientist.com, 15:12, Jul. 8, 2004, 2 pp.

Lee et al., Carbon nonotube p-n junction diodes, Appl. Phys. Lett., vol. 85, No. 1, Jul. 5, 2004, 145-147.

Rupesinghe et al., Field emission vacuum power switch using vertically aligned carbon nanotubes, J. Vac. Sci. Technol. B, vol. 21, No. 1, Jan./Feb. 2003, 338-343.

Teo, et al., Field emission from dense, sparse, and patterned arrays of carbon nanofibers, Appl. Phys. Lett., vol. 80, No. 11, Mar. 18, 2002, 2011-2013.

Nanotube, http://whatis.techtarget.com/definition/0,,sid9_gci514287,00.html, Jun. 5, 2004, 3 pp.

Carbon nanotube, http://wikipedia.org/wiki/Carbon_nanobute, Aug. 17, 2005, 6 pp.

Harris, Carbon nanotube science and technology, http://www.personal.rdg.ac.uk/~scsharip/tubes.htm, 6 pp.

Tommy, Diamond Nanotube Technology Promises New Electronics Products, www.linuxelectrons.com/article.php/20050804100641554, Aug. 4, 2005, 3 pp.

Nanotubes and Buckyballs, Nanotechnology Now, http://www.nanotech-now.com/nanotube-buckyball-sites.htm, Apr. 13, 2005, 6 pp.

* cited by examiner

NANO-BASED DEVICE AND METHOD

TECHNICAL FIELD

The invention relates generally to nano-based devices, such as nano-diodes or nano-switches.

BACKGROUND

Nanotechnology has become increasingly popular as a technique for fabricating various types of devices, such as diodes and switches. One type of element that has been studied for making nanotechnology-based devices is the carbon nanotube, which is a cylindrical carbon structure that exhibits certain desirable electrical properties.

Although carbon nanotubes are recognized as providing electrical characteristics that are efficient for forming diodes or switches, conventional diodes or switches that contain carbon nanotubes do not lend themselves to efficient or reliable manufacturing. Consequently, without devices that can be efficiently and reliably manufactured, cost efficient devices that employ carbon nanotubes are typically not available.

SUMMARY OF THE INVENTION

In general, according to some embodiments, a nano-based device has certain elements (e.g., nano-emitters of electrons) arranged in a planar or horizontal manner to enhance the ability to manufacture such a nano-based device in an efficient manner. In one example, a nano-based device includes a support structure providing a support surface, a second structure providing a second surface angled with respect to the support surface, and at least one nano-emitter provided on the second surface.

Other or alternative features will become apparent from the following description, from the drawings, and from the claims.

DETAILED DESCRIPTION OF THE INVENTION

In the following description, numerous details are set forth to provide an understanding of the present invention. However, it will be understood by those skilled in the art that the present invention may be practiced without these details and that numerous variations or modifications from the described embodiments may be possible. As used here, the terms "horizontal" and "vertical" are used to indicate relative positions of components depicted in the various figures. Note, however, that the devices illustrated in the figures can have orientations different from the orientations of the figures when in actual use. Thus, dependent upon the actual orientation of any described device when in actual use, the terms "horizontal" and "vertical" can refer to different orientations. The terms "horizontal" and "vertical" are intended to refer to relative orientations but can have different meanings when devices are in actual use. For example, "horizontal" can refer to a vertical orientation, and "vertical" can refer to a horizontal orientation when the device is rotated 90° or 270° from the orientations depicted in the figures. Also, the "horizontal" and "vertical" can refer to diagonal or inclined orientations in other contexts.

Figure 1:
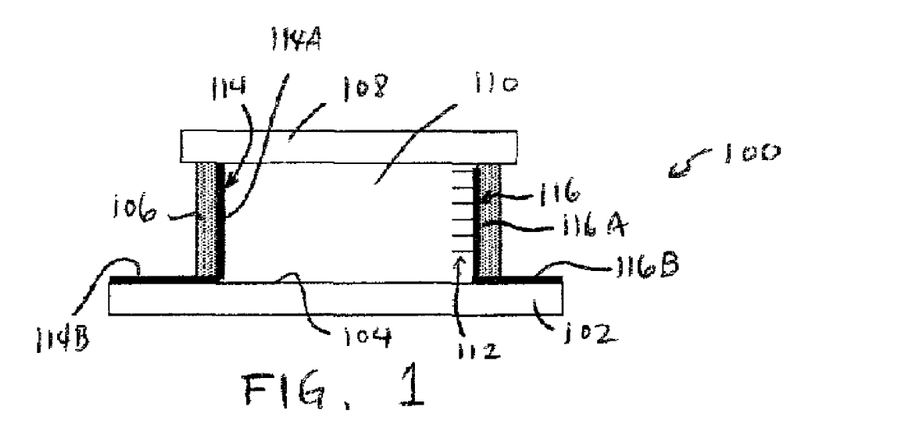
FIG. 1 is a side cross-sectional view of a nano-based device, according to an embodiment.
Figure 2:
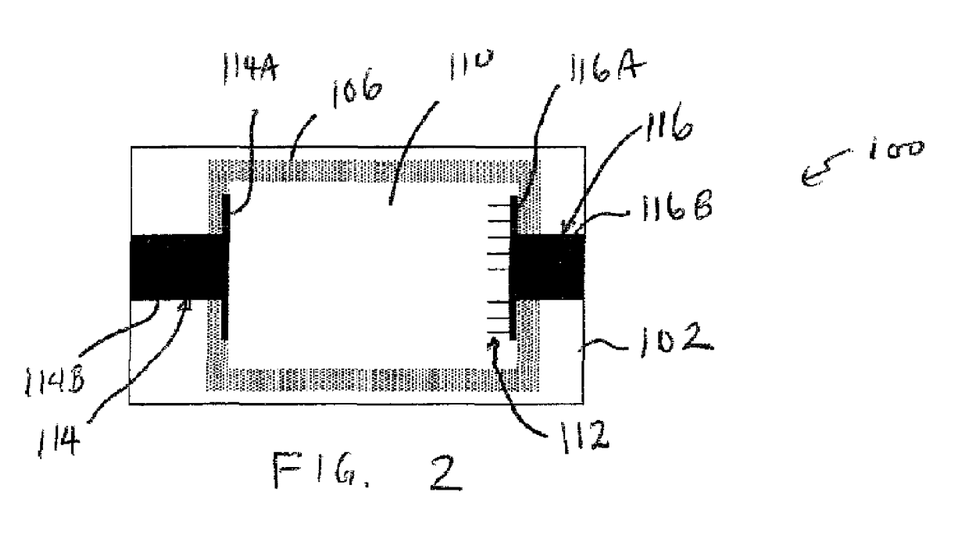
FIG. 2 is a top cross-sectional view of the nano-based device of FIG. 1.

FIGS. 1 and 2 illustrate a nano-based (or nano-electronic) device 100 according to an embodiment. As used here, the term "nano-based device" or "nano-technology device" refers to any device that includes nanotechnology-based features. For example, in the embodiment of FIGS. 1 and 2, the nanotechnology-based features include nano-emitters 112, which can be implemented with nanotubes of carbon or other materials or nano-sized diamonds.

A nanotube is a generally cylindrical structure formed of a particular material. A nanotube structure is basically a very small tube that has a wall thickness on the atomic scale. For example, a carbon nanotube is a tube in which the walls are formed of carbon molecules, where the wall thickness can be one molecule deep. Carbon nanotubes can be multi-layer, concentric tubes, called multi-walled carbon nanotubes (MWCNTs) or single-walled carbon nanotubes (SWCNTs). One type of nanotube includes carbon nanotubes, which include a cylindrical structure of carbon molecules. Carbon nanotubes exhibit certain electrical properties that make them efficient for forming certain types of devices, such as diodes or switches. Nanotubes can also be formed of other materials, such as silicon, molybdenum, titanium, boron nitride, and so forth.

A "nano-sized diamond" refers to a diamond crystal having grain size less than some predetermined value (e.g., 100 nanometers). A nano-sized diamond can be formed to a film-like structure. A nano-sized diamond film deposited on a surface using various techniques has relatively excellent electron emission characteristics, in some cases comparable to carbon nanotubes.

Nano-emitters 112 are used for emitting electrons to provide current flow between electrodes 114 and 116 in the nano-based device 100. The electrodes 114 and 116 are formed of an electrically conductive material to enable the electrodes 114 to carry electrical current in the nano-based device 100. As illustrated, the nano-emitters 112 are formed on a surface of the electrode 116 (such as by growing the nano-emitters on the electrode). The electrode 116 has two segments 116A and 116B, where the two segments 116A and 116B are angled with respect to each other (generally right angle in the example of FIG. 1). The electrode segment 116A is formed on a surface of a spacer 106 (which is formed of an electrically insulating material). The second segment 116B of the electrode 116 is formed on a support surface 104 of a support structure 102. The spacer 106 is mounted on the support surface 104 of the support structure 102.

In FIG. 2, the spacer 106 is shown as a generally rectangular structure mounted on the support structure 102. Alternatively, the spacer 106 can have other shapes, such as circles, ovals, and so forth.

Similarly, the electrode 114 has two segments 114A, 114B, with the first segment 114A mounted to another surface of the spacer 106, and the second segment 114B mounted to the support surface 104 of the support structure 102. Although reference is made to "spacer" in the singular sense, note that the spacer 106 can be one component having plural, integrally formed segments (such as the four walls depicted in FIG. 2). Alternatively, spacer 106 can be formed of plural distinct components attached together.

The electrode segments 114B, 116B (which are contact pads) can be electrically coupled to other circuitry arranged on the support surface 104 (or elsewhere) of the support structure 102. For example, the electrode segments 114B, 116B can be electrically connected to electrical traces on the support surface 104 that in turn can be connected to other circuitry.

The nano-based device 100 also includes a cover 108 formed over the spacer 106. The cover 108 and the support structure 102 are sealed to the spacer 106 such that a hermetically sealed chamber 110 is defined. The sealed chamber 110 can contain either a vacuum or a gas.

As depicted in FIGS. 1 and 2, the electrodes 114 and 116 are spaced apart from each other. If configured as a diode, the electrode 116 forms a cathode, while the electrode 114 forms an anode. When a voltage difference is applied between electrodes 114 and 116, electrons are caused to be emitted from the nano-emitters 112 such that a current flows from the anode electrode 114 to the cathode electrode 116 through either the vacuum or gas contained in the chamber 110.

Alternatively, the nano-based device 100 can be configured as a switch. In this case, the chamber 110 contains a gas, which is a dielectric gas that is adapted to break down in response to application of greater than a predetermined voltage between the electrodes 114 and 116. Breakdown of the dielectric gas within the chamber 110 causes a discharge path to form between the electrodes 114 and 116 such that current flows between the electrodes 114 and 116 through the dielectric gas. In the switch configuration, the nano-emitters help to enhance the predictability of the discharge path through the dielectric gas contained in the chamber 110. In effect, the nano-emitters 112 function as micro-miniature lightning rods, where the ends of the nano-emitters concentrate and intensify a local electric field gradient to thereby stimulate ionization of nearby molecules of dielectric gas. Note that the nano-emitters 112 are electrically conductive such that current can flow through the nano-emitters to the electrode 116 on which the nano-emitters 112 are formed.

Note that the placement of electrodes 114 and 116 are such that the dimensions between electrodes 114 and 116 are controlled in a plane (horizontal plane in the orientation of FIG. 1) that is generally parallel to the support surface 104 of the support structure 102. This provides a "planar" arrangement of the electrodes 114 and 116 that enhances the ability to better achieve uniform and consistent spacing between electrodes 114 and 116 (along their respective widths) during manufacture of the nano-based device 100. Modern integrated circuit manufacturing technologies allow for superior control of horizontal dimensions as compared to vertical dimensions. If the electrodes were arranged vertically top to bottom in FIG. 1, then the vertical geometry would have to be closely controlled to achieve uniform thickness of the spacer 106 to provide uniform spacing between different parts of the electrodes 114 and 116. Standard integrated circuit fabrication techniques, such as for fabricating semiconductor devices, microelectro-mechanical systems (MEMS) devices or thin-film resistors, are typically not designed to maintain strict vertical tolerances. However, standard fabrication techniques are able to achieve precise horizontal (planar) tolerances.

The ability to achieve uniform spacing between electrodes 114 and 116 means that performance reliability of the nano-based device 100 is increased by increasing the likelihood of more consistent electrical behavior. Thus, efficient manufacture of the nano-based device 100 in large commercial quantities can be achieved. The efficient manufacture of nano-based devices in larger quantities means that the per-unit cost would be reduced.

More generally, the arrangement of the electrodes 114 and 116 on side surfaces of the spacer 106 causes the nano-emitters 112 to be arranged on a surface (in this case, a surface of the electrode 116) that is angled with respect to the support surface 104 of the support structure 102. In the FIG. 1 embodiment, the angle of the surface of electrode 116 on which the nano-emitters 112 are formed is generally 90° with respect to the support surface 104 of the support structure 102. As described further below, in other embodiments, the surface of a structure on which the nano-emitters 112 are formed can have other angles with respect to the support surface 104 of the support structure 102. The angle of electrodes 114 and 116 with respect to the support surface 104 of the support structure 102 can be adjusted for optimized electrical performance and manufacturability.

The arrangement depicted in FIG. 1 also allows for current flow that is parallel to the general direction of the lengths of the nano-emitters 112, which provides enhanced performance. Also, the horizontal (or planar) arrangement of the nano-based device 100 provides a consistent distance between each of the nano-emitters 112 and the opposite electrode 114. This consistent separation improves the threshold voltage for initiating the turning on of the nano-based device 100 (e.g., turning on a diode or a switch). Also, more uniform current flow within the nano-based device between electrodes 114 and 116 can be achieved to ensure more consistent sharing of the current load among the nano-emitters 112.

The nano-emitters 112 can be arranged as a two-dimensional array of nano-emitters on a surface of the electrode 116. Alternatively, instead of being formed as an array, the nano-emitters 112 can just be a line of nano-emitters. Also, instead of plural nano-emitters, just one nano-emitter can be provided on the electrode 116.

Alternatively, instead of forming nano-emitters on just one electrode 116, nano-emitters can also be formed on the other electrode 114. Providing nano-emitters on both electrodes 114 and 116 further enhances the flow of current between the electrodes 114 and 116 in the nano-device 112.

Figure 3:
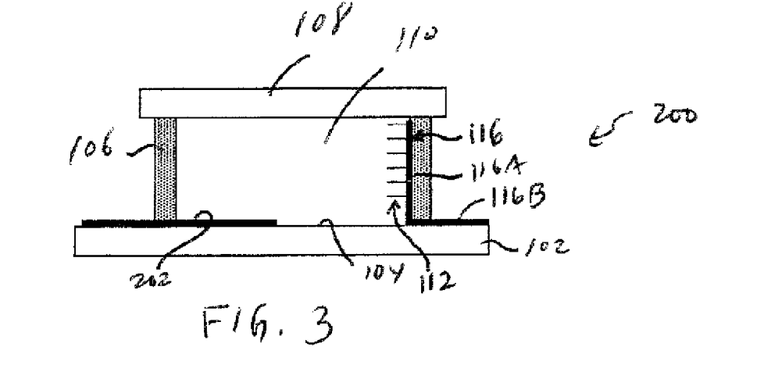
FIGS. 3-5 illustrate nano-based devices according to other embodiments.

FIG. 3 shows a nano-based device 200 according to another embodiment. Elements in the nano-based device 200 that are the same as elements of the nano-based device 100 of FIG. 1 share the same reference numerals. In the nano-based device 200, instead of being formed on a surface of the spacer 106, an electrode 202 is formed entirely on the support surface 104 of the support structure 102. Thus, in FIG. 3, the electrode 202 is a layer of electrically conductive material that is formed on the support surface 104. The electrode 202 is generally perpendicular to the electrode portion in 116A on which the nano-emitters 112 are mounted. In this configuration, current flows at an angle with respect to the nano-emitters 112 between the electrodes 116 and 202.

Figure 4:
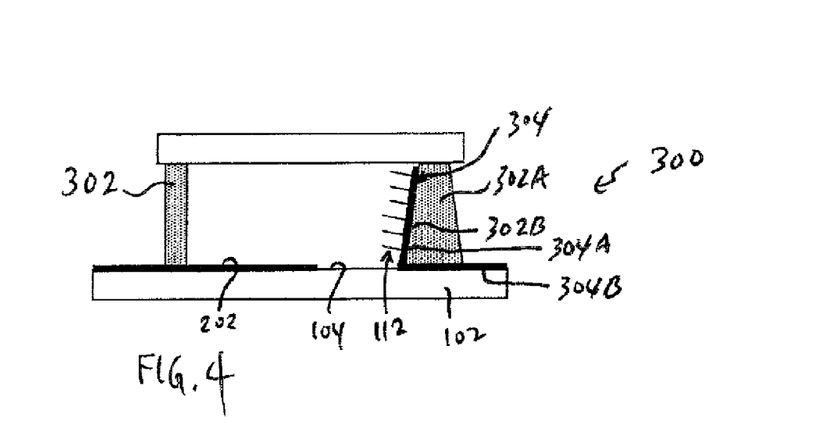

FIG. 4 shows yet another embodiment of a nano-based device 300. In the nano-based device 300, a spacer 302 is used instead of the spacer 106 in the nano-based device 100 or 200 of FIG. 1 or 3. The spacer 302 has a portion 302A that defines an angled surface 302B on which a segment 304A of an electrode 304 is formed. The electrode 304 has another segment 304B formed on the support surface 104. The angled surface 302B of the spacer portion 302A causes the electrode segment 304A to be angled upwardly such that nano-emitters 112 formed on the electrode segment 304A point slightly upwardly (away from the support surface 104). The electrode segment 304A is thus at a different angle with respect to the support surface 104 of the support structure 102 than the angle of the electrode segment 116A of FIG. 1 or 3. The angle between the electrode segment 304A and the support surface 104 is greater than 90°. Such an angle can allow for enhanced growth of nano-emitters 112 on the electrode segment 304A. Enhanced growth is provided by allowing nanotubes to be grown over a greater effective surface area of the electrode segment 304A.

In a variation of the nano-based device 300, the spacer portion 302A can be changed such that the surface 302B is angled downwardly toward the support surface 104 of the support structure 102, rather than away from the support surface 104. In this variation, the electrode segment 304A would have an angle with respect to the support surface of less than 90°. Moreover, nano-emitters formed on such an arranged electrode segment 304A would point slightly downwardly toward the support surface 104.

In each of the FIG. 3 and FIG. 4 embodiments, nano-emitters can also be formed on the electrode 202 in addition to, or instead of, nano-emitters 112 on the electrode 116 or 304.

In the embodiments depicted in FIGS. 1-4, the spacer 106 or 302 is a separate component from the support structure 102. Alternatively, in FIG. 5, a nano-based device 400 includes a support structure 402 which provides integral side walls 404 and 406 on which respective electrodes 408 and 410 are formed. Thus, in the FIG. 5 embodiment, the side walls 404, 406 are part of the support structure 402, rather than part of a separate spacer (such as 106 or 302 in FIG. 1, 3, or 4). The side walls 404, 406 can be grown from an initial planar structure forming the support structure 402. Alternatively, the side walls 404, 406 can be formed by removing material to create a dent as depicted. Nano-emitters 112 are formed on a surface of the electrode 408. The side walls 404, 406 provide inclined surfaces (inclined upwardly away from a lower horizontal surface 412 of the support structure 402). The electrodes 408 and 410 are mounted on the inclined surfaces. As a result, nano-emitters 112 formed on the inclined surfaces point away from the lower horizontal surface 412. In other embodiments, the side walls 404, 406 can provide vertical surfaces (on which the electrodes 408, 410 are mounted) that are generally perpendicular to the horizontal surface 412. In yet another embodiment, the side walls 404, 406 provide inclined surfaces (to which electrodes 408, 410 are mounted) that point slightly downwardly toward the horizontal surface 412.

Figure 5:
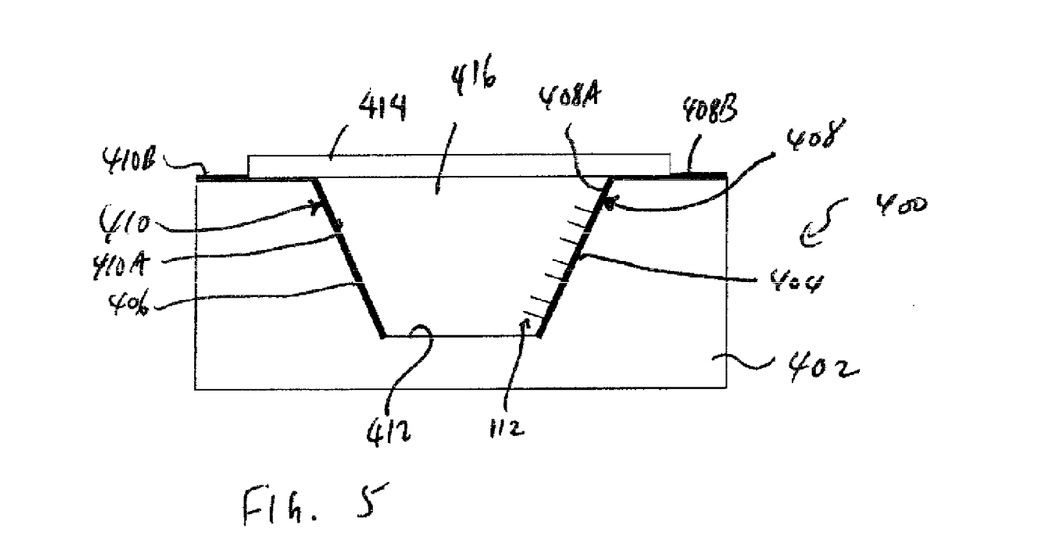

The electrode 408 has a first segment 408A and a second segment 408B, where the segments 408A and 408B are angled with respect to each other. The electrode segment 408A is formed on the inclined surface of the side wall 404, whereas the electrode segment 408B is formed on an upper horizontal surface of the support structure 402. Similarly, the electrode 410 has segments 410A and 410B that are angled with respect to each other. The segment 410A is formed on the inclined surface of the side wall 406, whereas the segment 410B is formed on an upper horizontal surface of the support structure 402.

Nano-emitters can be formed on the electrode segment 410A instead, or in addition to, the nano-emitters 112 formed on the electrode segment 408A. Also, in a different arrangement, an electrode can be formed on the lower horizontal surface 412 instead of one of the inclined surfaces of side walls 404, 406. A cover 414 is formed over the upper horizontal surface of the support structure 402 to define a sealed chamber 416 that can contain either a vacuum or a gas. The lower horizontal surface 412 and side walls 404, 406 define a dent that forms the chamber 416.

Figures 6, 7:
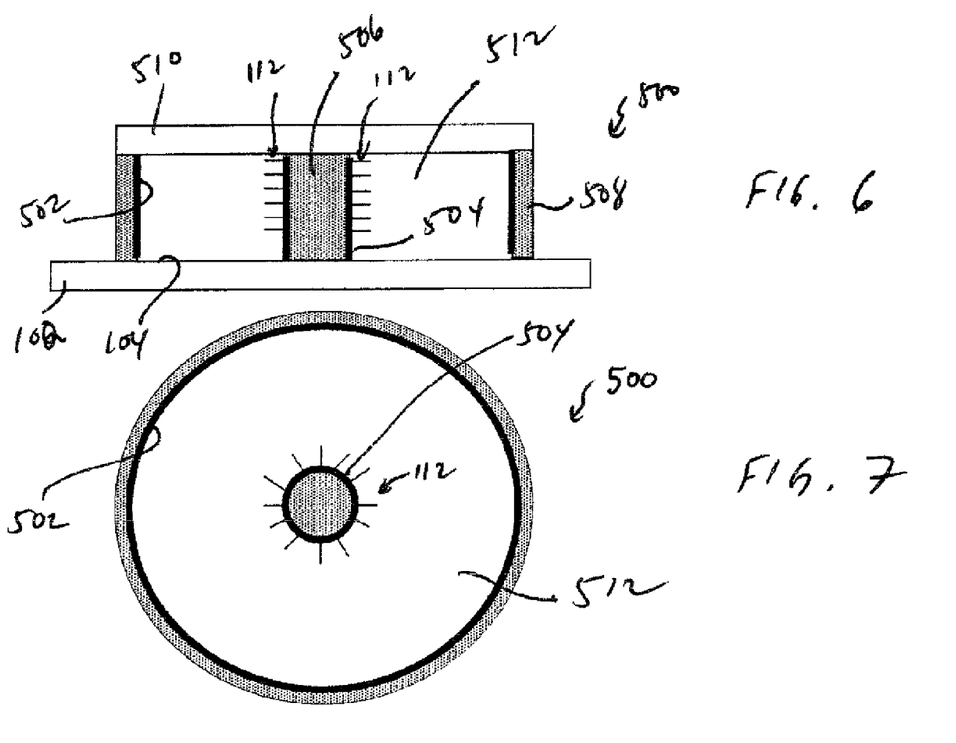
FIG. 6 is a side cross-sectional view of a nano-based device according to yet a further embodiment.
FIG. 7 is a top cross-sectional view of the nano-based device of FIG. 6.

FIGS. 6 and 7 show a nano-based device 500 according to a further embodiment, in which the electrodes 502 and 504 of the nano-based device 500 are generally cylindrical in shape. In this embodiment, a center post 506 (generally cylindrical in shape) is formed on the support surface 104 of the support structure 102. The inner electrode 504 is formed on the outer surface of the center post 506. Also, a spacer 508 (also cylindrical in shape) is provided around the outside of the outer electrode 502. A cover 510 is formed on top of the spacer 508, electrodes 502 and 504, and center post 506. A sealed chamber 512 is formed by the assembly of the cover 510, support structure 102, and the spacer 508. The cylindrical arrangement of the components of the nano-based device 500 allows for larger current capacity between the electrodes 502 and 504 due to greater surface area of the electrodes and larger number of nano-emitters 112.

The nano-emitters 112 are mounted on a surface of the electrode 504 and point towards the opposing electrode 502. The nano-emitters 112 are generally parallel to the support surface 104 in the arrangement of FIG. 6. Alternatively, the nano-emitters 112 can be mounted on the electrode 502 in addition to, or instead of, the electrode 504.

Figure 8:
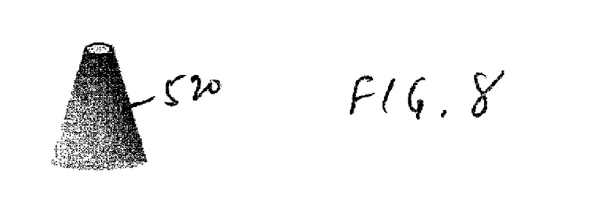
FIG. 8 illustrates an alternative center post that can be used in the nano-based device of FIGS. 6 and 7.

FIG. 8 shows an alternative center post 520 that can be used in place of the center post 506 of FIGS. 6 and 7. The center post 520 is generally cone-shaped, which would cause the electrode 504 to also achieve a general conical shape that would cause the nano-emitters 112 to be angled upwardly away from the support surface 104 of the support structure 102. Alternatively, the center post 520 can be flipped upside down such that the nano-emitters 112 are angled downwardly toward the support surface 104 of the support structure 102.

When viewed from the top (FIG. 7), the nano-based device 500 has a generally circular cross-section. However, in alternative implementations, the nano-based device can have other cross-sectional shapes, such as triangular, square, hexagonal, pentagonal, and other generally polygonal shapes including shapes having unequal interior angles and sides.

Figure 9:
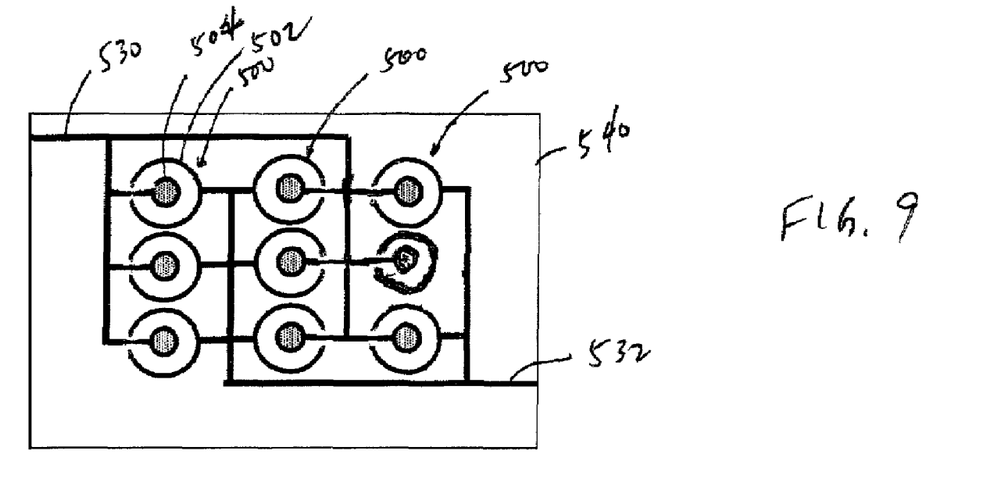
FIG. 9 illustrates an arrangement of an array of nano-based devices, according to an embodiment.

FIG. 9 shows an array of nano-based devices 500 mounted on a support surface of a support structure 540. The center electrodes 504 of the nano-based devices 500 are connected to an electrically conductive trace 530, while the outer electrodes 502 of the nano-based devices 500 are electrically connected to an electrically conductive trace 532. The electrically conductive traces 530 and 532 are also formed on the support surface of the support structure 540.

By connecting the plurality of nano-based devices 500 in parallel, a larger current capacity can be achieved. For example, the array of nano-based devices 500 can be used in power applications (e.g., as power switches) where large amounts of current capacity is desirable.

Instead of the cylindrical-shaped nano-based devices 500, an array of other types of nano-based devices can be used, such as any of the nano-based devices depicted in FIGS. 1-5, as well as other types of nano-based devices.

Figure 10:
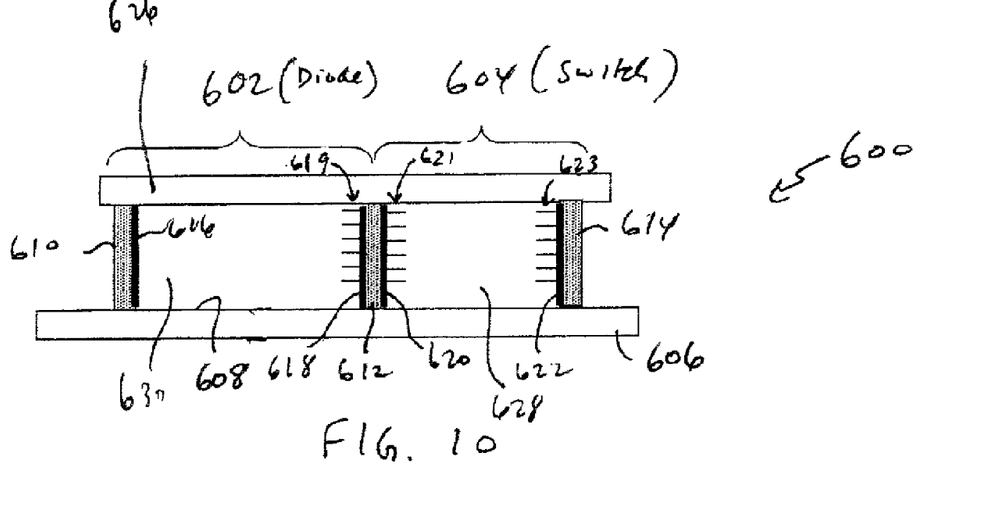
FIG. 10 illustrates a combined nano-switch and nano-diode, according to an embodiment.

In the embodiments depicted in FIGS. 1-9, the nano-based devices are shown as stand-alone devices that can be configured as either nano-diodes or nano-switches. FIG. 10 shows a combined nano-based device 600 that includes both a nano-diode 602 and a nano-switch 604. Spacers 610, 612, 614 are formed on a support surface 608 of a support structure 606.

An electrode 616 is formed on a surface of the spacer 610, an electrode 618 is formed on a surface of the spacer 612, an electrode 620 is formed on another surface of the spacer 612, and an electrode 622 is formed on a surface of the spacer 614. Nano-emitters 619 are formed on a surface of the electrode 618, nano-emitters 621 are formed on a surface of the electrode 620, and nano-emitters 623 are formed on a surface of the electrode 622. Each of the electrodes 616, 618, 620, 622 are angled with respect to the support surface 608 of the support structure 606. In the FIG. 10 implementation, the angle is generally a right angle. In alternative implementations, different angles of the electrodes 616, 618, 620, and 622 with respect to the support surface 608 can be provided. The nano-diode 602 and nano-switch 604 of FIG. 10 share a common node (spacer 612, for example). Alternatively, the nano-diode 602 and nano-switch 604 can also share a common electrode by electrically connecting electrodes 618 and 620.

A cover 626 provided over the spacers 610, 612, and 614 provides sealed chambers 628 and 630. The chamber 628 contains a dielectric gas such that the dielectric gas breaks down in response to greater than a predetermined voltage applied across electrodes 620 and 622. Breakdown of the dielectric gas 628 causes electrical current to flow between the electrodes 620 and 622 (to cause the switch 604 to close).

The chamber 630 of the diode 602 can contain either a gas or a vacuum. In response to application of greater than a predetermined voltage (which can be different from the predetermined voltage for turning on the switch 604), the nano-emitters 619 emit electrons that cause current to flow from the anode electrode 616 to the cathode electrode 618.

In alternative embodiments, other arrangements of combinations of nano-diodes and nano-switches can be provided. Also, alternatively, instead of two separate chambers 628 and 630 to provide the combined nano-diode and nano-switch, a single chamber can be shared by the nano-diode and nano-switch.

Figure 11:
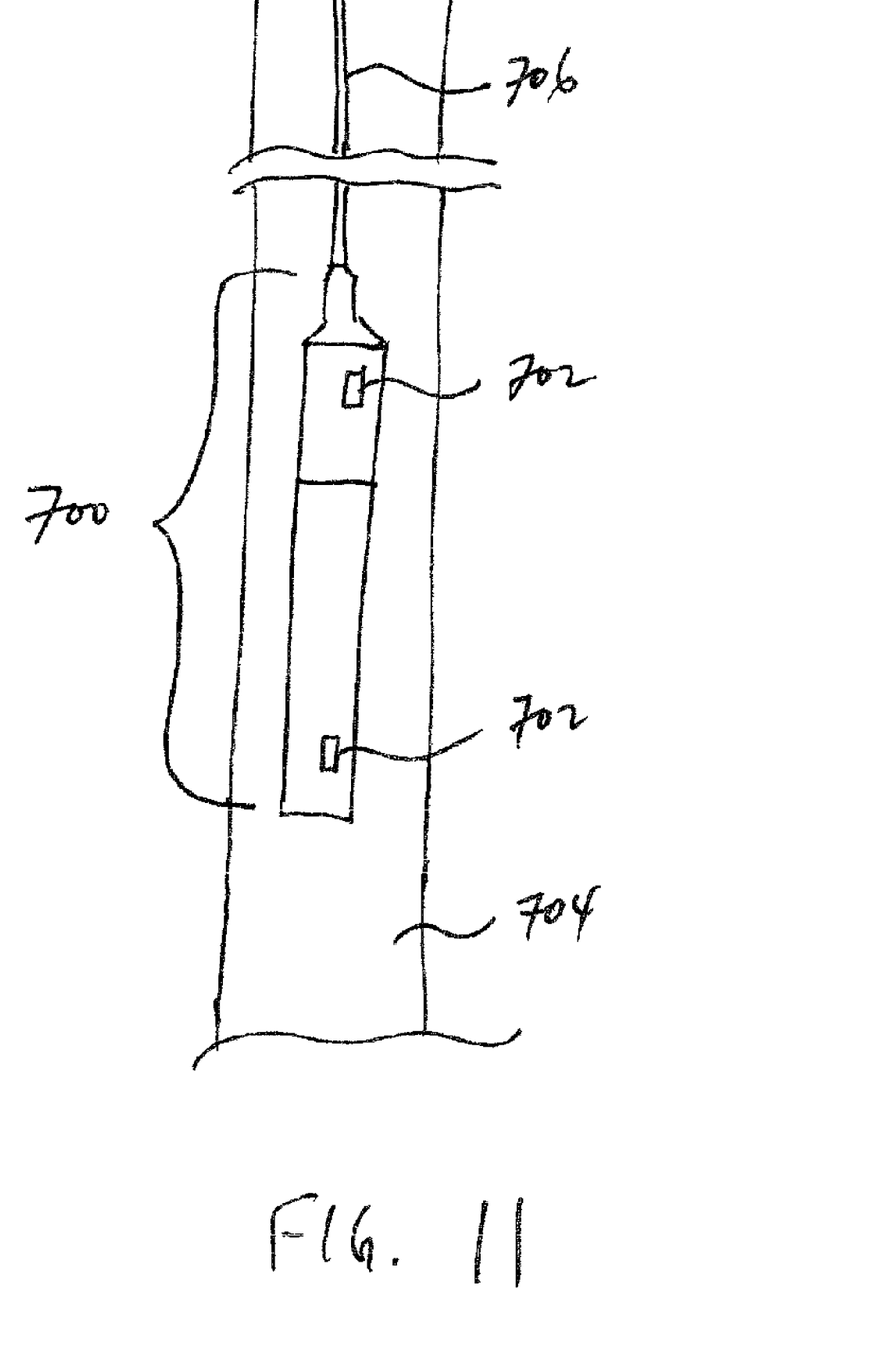
FIG. 11 illustrates a tool string that can be employed in a well, where the tool string includes nano-based devices according to some embodiments.

The nano-based devices described above can be used in any number of different applications. For example, they can be used in integrated circuit devices, power-related components, and so forth. Also, as depicted in FIG. 11, nano-based devices 702 can be used in a downhole tool 700 that is deployed into a wellbore 704. The tool 700 is carried on a carrier line 706. The nano-based devices 702 can be nano-diodes or nano-switches used to activate various types of downhole devices, such as perforating guns, packers, pumps, and so forth.

While the invention has been disclosed with respect to a limited number of embodiments, those skilled in the art, having the benefit of this disclosure, will appreciate numerous modifications and variations therefrom. It is intended that the appended claims cover such modifications and variations as fall within the true spirit and scope of the invention.

What is claimed is:

1. A nano-based device, comprising:
a support structure providing a support surface;
a first electrically conductive structure providing a second surface angled with respect to the support surface;
at least one nano-emitter of electrons provided on the second surface;
a second electrically conductive structure;
at least one nano-emitter of electrons provided on the second electrically conductive structure; and
a dielectric material between the first and second electrically conductive structures, wherein the first electrically conductive structure, dielectric, second electrically conductive structure, and nano-emitters form a switch that when activated causes breakdown of the dielectric such that an electric current path is provided through the dielectric to allow electrical current to flow between the first and second electrically conductive structures.

2. The nano-based device of claim 1, further comprising a spacer mounted on the support surface of the support structure, the first electrically conductive structure formed on a surface of the spacer.

3. The nano-based device of claim 1, wherein the nano-emitters comprise nanotubes.

4. The nano-based device of claim 3, wherein the nanotubes comprise one of carbon nanotubes, silicon nanotubes, titanium nanotubes, boron nitride nanotubes, and molybdenum nanotubes.

5. The nano-based device of claim 1, wherein the nano-emitters comprise nano-sized diamonds.

6. The nano-based device of claim 1, wherein an array of nano-emitters are provided on each of the first and second electrically conductive structures.

7. The nano-based device of claim 1, wherein the second surface is angled upwardly away from the support surface.

8. The nano-based device of claim 1, wherein the second surface is angled downwardly toward the support surface.

9. The nano-based device of claim 1, wherein the second surface is generally at a right angle with respect to the support surface.

10. The nano-based device of claim 1, wherein the support structure has a dent, the second structure provided on a side surface of the dent.

11. The nano-based device of claim 1, wherein the first electrically conductive structure comprises a cylindrical structure.

12. The nano-based device of claim 11, further comprising:
a generally cylindrical center post, the first electrically conductive structure mounted on a surface of the center post; and
a generally cylindrical spacer surrounding the first electrically conductive structure;
wherein the second electrically conductive structure comprises a generally cylindrical electrode formed on a surface of the spacer, wherein the electrode is spaced apart from the first electrically conductive structure.

13. The nano-based device of claim 1, wherein the first electrically conductive structure comprises a first electrode, the nano-based device further comprising:
a first spacer providing a first surface on which the first electrode is mounted;
wherein the second electrically conductive structure comprises a second electrode mounted on another surface of the first spacer;
a second spacer mounted on the support structure;
a third electrode mounted on a surface of the second spacer;
a third spacer mounted on the support structure;
a fourth electrode mounted on a surface of the third spacer; and
additional nano-emitters formed on at least the second and fourth electrodes. provide the current flow path through the dielectric.

14. The nano-based device of claim 1, wherein the dielectric material comprises a dielectric gas.

15. An apparatus comprising:
a support structure providing a support surface; and
a nano-switch mounted on the support surface, the nano-switch comprising:
a first electrode providing a surface angled with respect to the support surface,
a second electrode spaced apart from the first electrode, nano-emitters provided on one or more of the first and second electrodes, and a dielectric material between the first and second electrodes configured to break down upon application of a voltage between the first and second electrodes to provide a current flow path through the dielectric.

16. The apparatus of claim 15, further comprising a downhole tool containing the support structure and the nano-switch.

17. The apparatus of claim 15, wherein the nano-emitters comprise one of nanotubes and nano-sized diamonds.

18. The apparatus of claim 15, wherein the dielectric material comprises a dielectric gas.

* * * * *